United States Patent
Tseng et al.

(10) Patent No.: US 11,662,861 B1
(45) Date of Patent: May 30, 2023

(54) EDGE DISPLAY HAVING ELECTROSTATIC DISCHARGE PROTECTION

(71) Applicant: Dell Products L.P., Round Rock, TX (US)

(72) Inventors: Kuo-Wei Tseng, Zhongzheng Dist. (TW); Hong-Ji Huang, Kinyi Dist. (TW); Yu-Chen Liu, Hsinchu (TW); Chun-Wei Huang, East Dist. (TW); Chi-Fong Lee, Taoyuan (TW)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/733,300

(22) Filed: Apr. 29, 2022

(51) Int. Cl.
G06F 3/044 (2006.01)
G02F 1/1335 (2006.01)
G02F 1/1333 (2006.01)

(52) U.S. Cl.
CPC .......... *G06F 3/044* (2013.01); *G02F 1/13338* (2013.01); *G02F 1/133528* (2013.01); *H10K 50/86* (2023.02); *H10K 59/126* (2023.02); *H10K 59/40* (2023.02)

(58) Field of Classification Search
CPC ................ G06F 3/044; G02F 1/13338; G02F 1/133528; H01L 27/323; H01L 27/3272; H01L 51/5281
See application file for complete search history.

(56) References Cited

U.S. PATENT DOCUMENTS

| | | | | |
|---|---|---|---|---|
| 2010/0277663 | A1* | 11/2010 | Koo | G02F 1/13452 349/58 |
| 2014/0133174 | A1* | 5/2014 | Franklin | F21V 9/08 362/606 |
| 2016/0161813 | A1* | 6/2016 | Lee | G02F 1/1336 349/40 |
| 2017/0005083 | A1* | 1/2017 | Choi | H01L 27/3276 |
| 2017/0059926 | A1* | 3/2017 | Kim | G02F 1/133308 |
| 2018/0321779 | A1* | 11/2018 | Huang | G06F 3/0412 |
| 2020/0227504 | A1* | 7/2020 | Luo | G06F 1/182 |
| 2023/0008336 | A1 | 1/2023 | Schwager et al. | |
| 2023/0010653 | A1 | 1/2023 | Schwager et al. | |
| 2023/0011051 | A1 | 1/2023 | Schwager et al. | |

* cited by examiner

*Primary Examiner* — Hong Zhou
(74) *Attorney, Agent, or Firm* — Zagorin Cave LLP; Robert W. Holland

(57) ABSTRACT

An information handling system presents visual images at a display that includes a display panel having a capacitive touch detection surface supported by an indium tin oxide layer disposed between a front layer, such as polarizer, and a display cell. To prevent excessive charge build up associated with the capacitive touch detection surface, a conductive ink is applied at the display panel perimeter and interfaced with a ground at the rear side of the display panel. In one example embodiment, a non-conductive ink insulates the conductive ink from the display panel except as desired to transfer excess charge from the indium tin oxide layer. The conductive ink may interface directly with the indium tin oxide layer or indirectly through a second non-conductive ink having greater conductivity than the insulative non-conductive ink.

17 Claims, 5 Drawing Sheets

EDGE DISPLAY HAVING ELECTROSTATIC DISCHARGE PROTECTION

BACKGROUND OF THE INVENTION

Field of the Invention

The present invention relates in general to the field of information handling system displays, and more particularly to an information handling system edge to edge display having electrostatic discharge protection.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems process information with processing components disposed in a housing to present the information as visual images at a display, such as a liquid crystal display (LCD) or organic light emitting diode (OLED) display. In some instances, the displays accept end user inputs at touches to the display panel that are detected by a capacitive touch sensor and reported to the information handling system based upon touch position. Generally, capacitive touch detection relies upon detection of proximate objects, such as a human finger, by the near field effect of the object on an electric field created by the touch detection sensor. One difficulty with capacitive touch detection is that the electric field generated at a glass display surface can result in electrostatic discharge (ESD) that disrupts creation of visual images by a display cell. For instance, ESD can create random black spots in a display visual image by disrupting LCD display cell pixels settings. Further, ESD can disrupt touch detection resulting in false inputs and failed detection of inputs.

Generally, ESD at a display front face is managed by coupling a conductive tape from front of the display to a ground of the display support structure, such as a conductive chassis material. The conductive tape couples at an edge of the display where visual images are not presented and is covered by a decorative feature, such as a bezel that fits over the perimeter of the display or a painted perimeter of a glass cover that fits over the display panel. End users tend to prefer displays that have an edge-to-edge appearance without a bezel or other decorative perimeter cover. For example, an edge-to-edge display uses the front polarizer as the front face and includes the capacitive touch sensor with the display cell instead of in an outer glass cover. The front polarizer extends to the perimeter of the display support structure so that the display chassis and housing is not visible. The edge of the display panel is typically protected by a plastic or rubber bumper placed outside the perimeter of the display panel. Thus, edge-to-edge displays do not have a cosmetic structure to hide conductive tape for grounding the front of the display panel.

SUMMARY OF THE INVENTION

Therefore, a need has arisen for a system and method which manages electrostatic discharge at a display having touch detection.

In accordance with the present invention, a system and method are provided which substantially reduce the disadvantages and problems associated with previous methods and systems for managing electrostatic discharge at a display having touch detection. Conductive ink is applied at a perimeter side surface of the display panel and interfaced with ground to maintain charge associated with the display panel in a range that avoids electrostatic discharge that disrupts presentation of visual images at the display panel, such as by creating black spots. For instance, conductive ink interfaces with an indium tin oxide layer disposed between the display panel outer surface and the display cell that generates visual images for presentation so that electrostatic discharge associated with capacitive touch detection leaks in a controlled manner to ground.

More specifically, an information handling system processes information with a processor that executes instructions in cooperation with a memory that stores the instructions and information. The information is presented at a display as visual images, such as by pixel values defined by a graphics processor and scanned by a timing controller to a display panel having a matrix of pixels, such as an LCD display panel having an LCD display cell with an outer cover and an underlying backlight. Capacitive touch is provided with a capacitive touch sensor integrated in the LCD display cell that senses touches to the display panel outer cover, such as an outer front facing polarizer. An indium tin oxide layer between the front polarizer and LCD display cell enhances touch detection of the capacitive touch sensor. A conductive ink applied to the edge of the display cell and interfaced with the indium tin oxide layer provides a conductive path to ground, such a conductive support structure of the display, to prevent electrostatic discharge that can disrupt display cell presentation of visual images. The conductive ink layer may include a non-conductive ink layer between the LCD display cell and conductive ink to insulate the LCD display cell from transfer of charge from the conductive ink. The conductive ink layer may also include a non-conductive ink layer between the indium tin oxide layer so that charge leaks to the conductive ink in a controlled manner that helps to maintain touch detection operations and accuracy.

The present invention provides a number of important technical advantages. One example of an important technical advantage is that a multilayer conductive ink structure is applied to a display panel perimeter side surface that provides a conductive path to ground to manage electrostatic discharge associated with touch detection. The conductive ink avoids impact on display industrial design and is implemented without mechanical adjustments. Selection of conductive inks of varying resistivity adjusts the management of electrostatic discharge so that visual image presentation at the display panel is not impaired, such as by black spots, and touch detection sensitivity is maintained. The multilayer conductive ink solution adapts by adjustments in conductive ink resistivity to different types and sizes of display cells and capacitive touch sensor operations.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An information handling system display electrostatic discharge is managed with conductive ink applied at the display panel perimeter and interfaced with ground. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
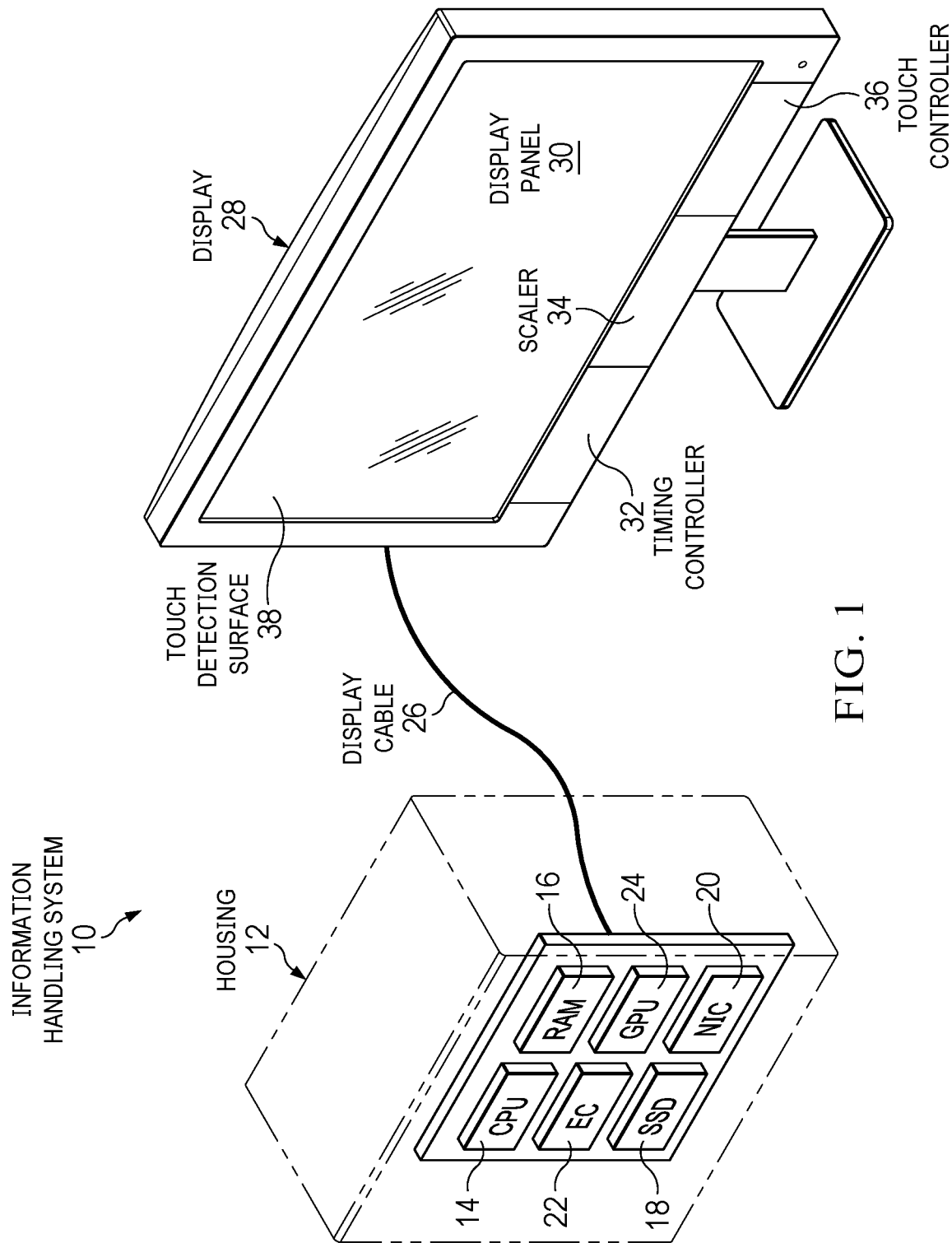
FIG. 1 depicts an information handling system interfaced with a peripheral display having a touchscreen display panel.

Referring now to FIG. 1, an information handling system 10 interfaces with a peripheral display 28 having a touchscreen display panel 30. Information handling system 10 has a desktop configuration with a stationary housing 12 holding processing components that cooperate to process information. In an alternative embodiment, the present disclosure may be used with a portable information handling system that incorporates the display in a common housing. A central processing unit (CPU) 14 executes instructions that process information in cooperation with a random access memory (RAM) 16 that stores the instructions and information. A solid state drive (SSD) 18 has persistent storage to store the instructions and information during power down of the system, such as an operating system and applications that are retrieved for execution to CPU 14 at power up of the system. A network interface controller (NIC) 20 provides network communications with external networks and devices. An embedded controller 22 manages cooperation of the processing components, such as for application of power, and also coordinates interactions with peripheral devices, such as a keyboard or touch inputs made at display 28. A graphics processing unit (GPU) 24 further processes the information to generate visual images for presentation at display 28, such as by defining pixel values communicated to display 28 through a display cable 26.

Display 28 presents visual images communicated from GPU 24 through display cable 26 at a display panel 30, such as a liquid crystal display (LCD) panel or organic light emitting diode (OLED) display panel. For example, pixel values communicated through display cable 26 are scanned to pixels of display panel 30 by a timing controller 32 and presentation of visual image resolution is managed by a scalar 34. A touch controller 36 interfaces with a touch detection surface 38 to report end user touches through display cable 26 to GPU 24 and/or embedded controller 22 for application by CPU 14, such as for operating system inputs. In the example embodiment, touch detection surface 38 is a capacitive touch detection surface that generates electronic fields and detects touches by changes in the electronic fields due to near field effects. For instance, a thin film transistor (TFT) LCD display with embedded touch detection senses changes in capacitance through a cover glass or other material of the front cover of display panel 30. To help improve touch sensitivity, an indium tin oxide layer is disposed between the front surface and the display panel cell, as shown in greater depth below. The electronic field can create an electrostatic discharge that disrupts presentation of visual images at display panel 30, such as by creating black spots.

Figure 2A:
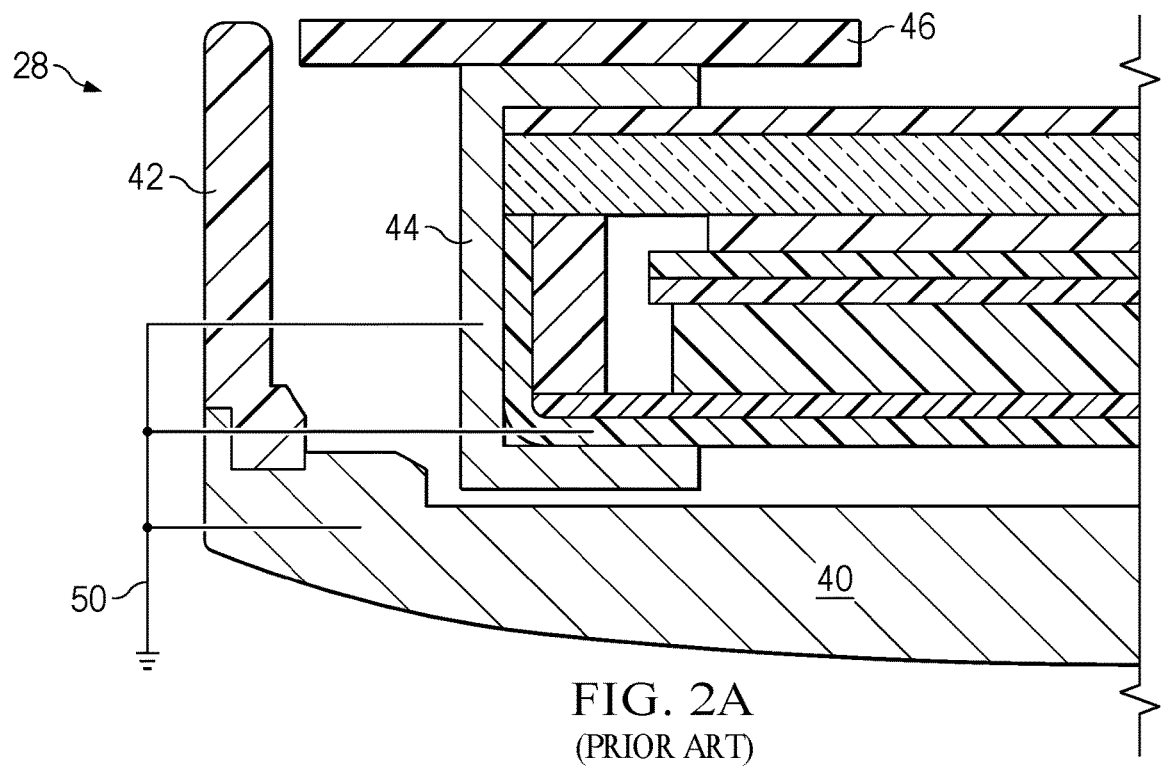
FIGS. 2A and 2B depict cross-sectional views of prior art displays having a ground to manage touchscreen display electrostatic discharge.
Figure 2B:
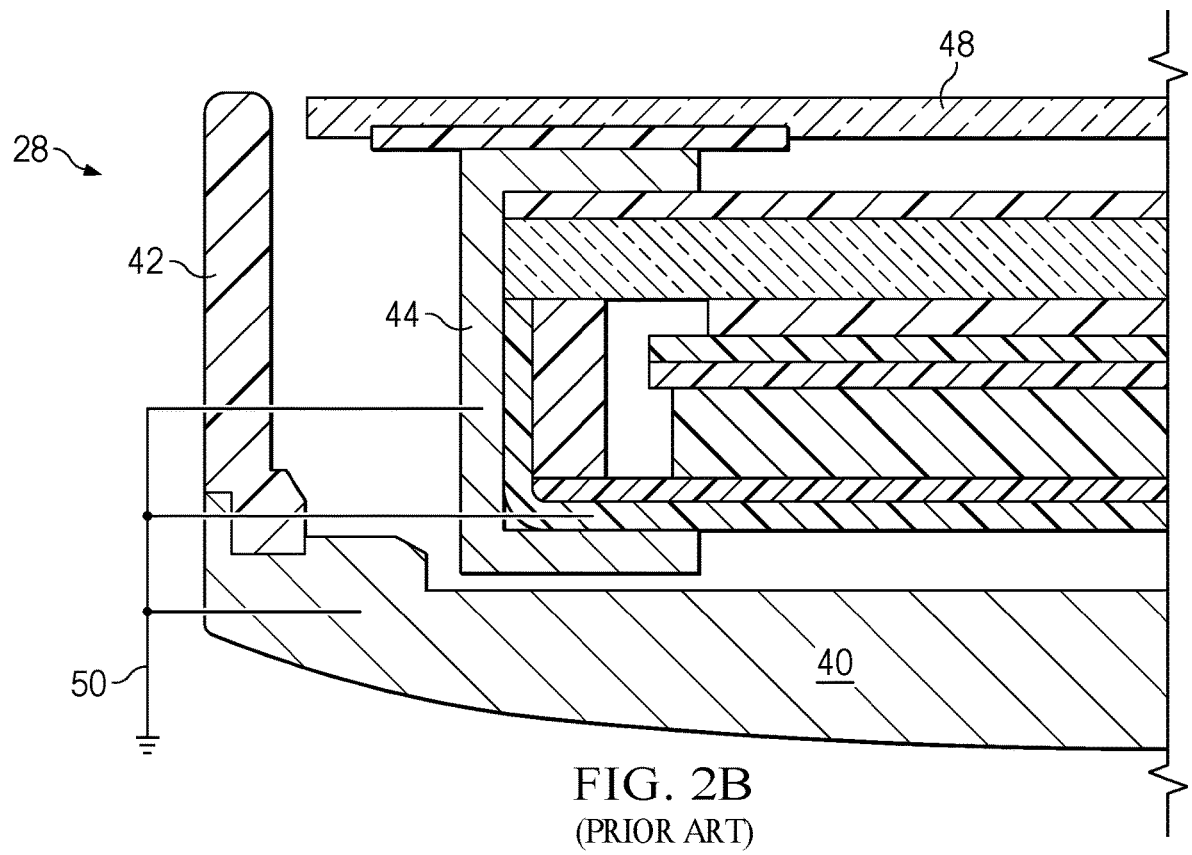

Referring now to FIGS. 2A and 2B, cross-sectional views depict prior art displays 28 having a ground to manage touchscreen display electrostatic discharge. In order to alleviate electrostatic discharge at the display front surface, a conductive tape contacts the display front surface and runs to the rear of the display panel where a ground 50 is contacted in the display housing support structure 40. FIG. 2A depicts a display 28 that has a bezel 46 placed over the conductive tape 44 and adjacent a plastic bumper 42. FIG. 2B has a separate cover glass that has black ink around its perimeter to hide conductive tape 44, which contacts the display panel below the cover glass. In each of the example prior art displays the display industrial design includes a decorative feature at the perimeter of the display panel to hide conductive tape 44. Such decorative features are not available in an edge-to-edge display industrial design.

Figure 3:
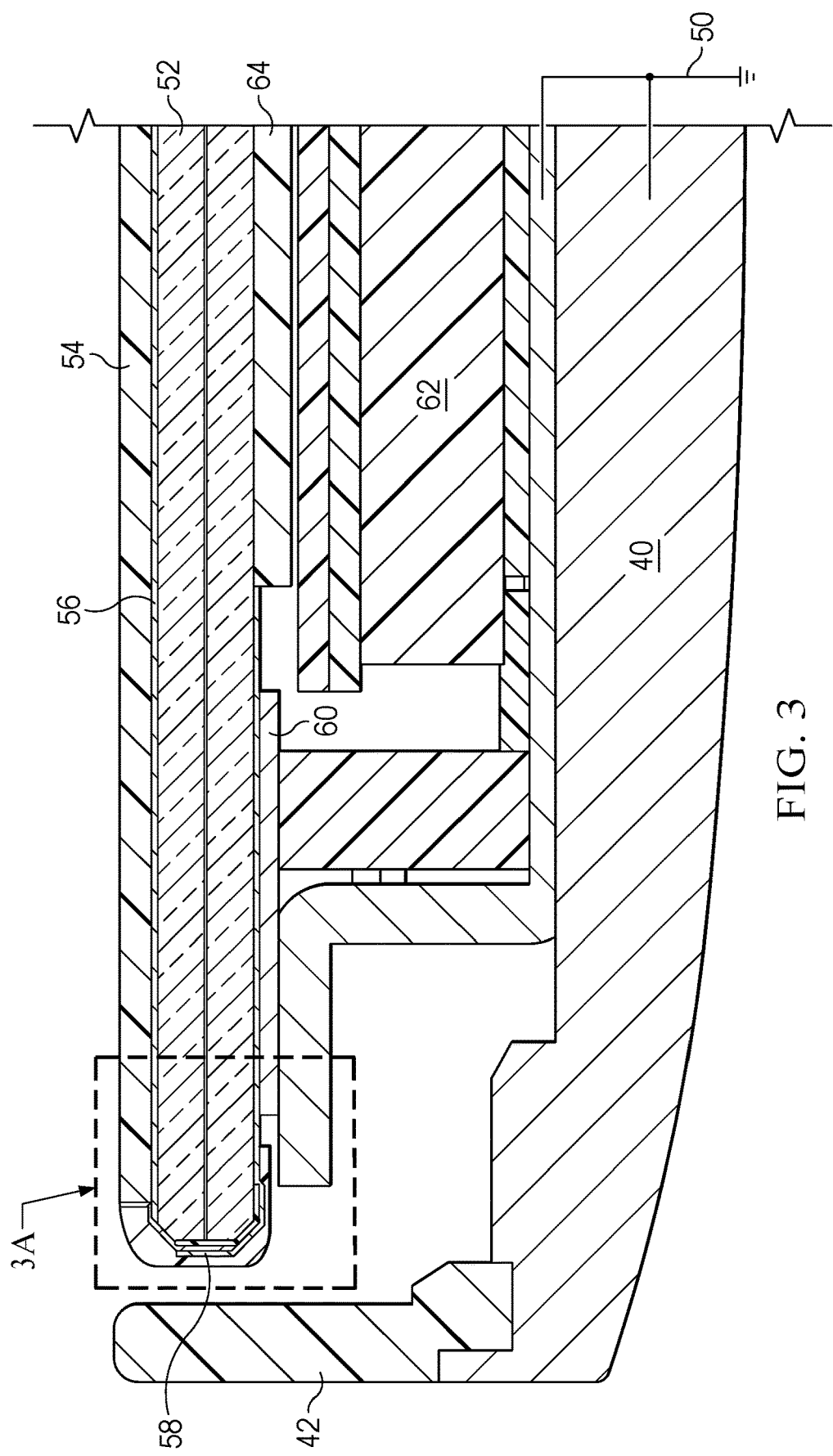
FIGS. 3 and 3A depict cross-sectional views of an edge-to-edge display having conductive ink interfaced with the display panel to manage electrostatic discharge.
Figure 3A:
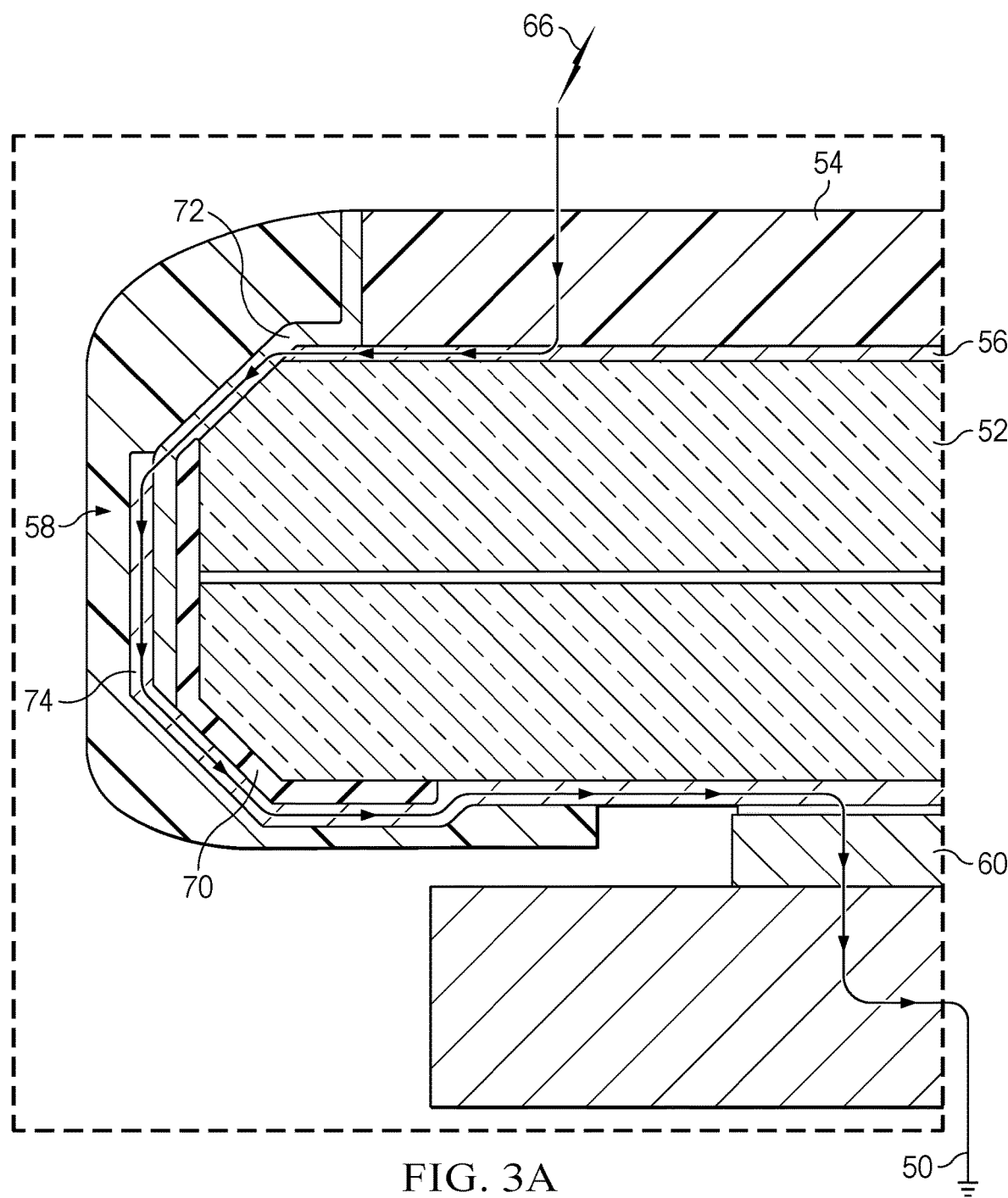

Referring now to FIGS. 3 and 3A cross-sectional views depict an edge-to-edge display having conductive ink interfaced with the display panel to manage electrostatic discharge. In the example embodiment, an edge-to-edge display is held in a conductive support structure 40 with a plastic bumper 42 at the display perimeter and no decorative edge construct, such as bezel. Display panel 30 is an LCD display panel having a front polarizer 54 exposed as a front surface and an LCD display cell 52 that includes pixels to generate visual images. The visual images are illuminated by a backlight 62 that directs light through a rear polarizer 64 and through LCD display cell 52 so that visual images defined by pixels of LCD display cell 52 are visible at front polarizer 54. LCD display cell 52 includes embedded capacitive touch detection that senses end user touches at front polarizer 54. An indium tin oxide layer 56 is disposed between front polarizer 54 and LCD display cell 52 to enhance capacitive touch detection through front polarizer 54. LCD display cell 52 couples at the rear side to conductive support structure 40, such as the display chassis, with a conductive tape 60 and over backlight 62 with an optical adhesive. Although the example embodiment depicts a liquid crystal display assembly, in an alternative embodiment other types of display assemblies may be used, such as an organic light emitting display assembly.

In order to avoid an excessive electrostatic discharge (ESD) that can disrupt presentation of visual images, such as by creating black spots, a conductive ink 58 is applied to the perimeter of LCD display cell 52 to define a conductive path from front polarizer 54 to ground 50 of conductive support structure 40. The conductive ink 58 conducts excessive electrical charge from the indium tin oxide to conductive tape 60 and conductive support structure 40 and ground 50. In the example embodiment, the conductive ink 58 is applied around the entire perimeter of LCD display cell 52 to provide a balanced electrostatic charge state at indium tin oxide layer 56 that will enhance touch detection by the embedded capacitive touch sensor of LCD display cell 52. In alternative embodiments, different distributions of conductive ink may be applied at the display panel perimeter to achieve a desired electric charge state in support of capacitive touch detection.

FIG. 3A depicts a detailed view of the application of conductive ink 58 to the perimeter of LCD display cell 52 in the example embodiment. To prevent leakage of charge into LCD display cell 52, a non-conductive ink layer 70 is first applied as shown along the vertical portions of the perimeter and under the LCD display cell 52 as shown. Non-conductive ink layer 70 has a sheet resistance of greater than or equal to $10^9$ Ohms per square to provide separation between indium tin oxide layer 56 and the display components within the glass of LCD display cell 52. In the example embodiment, non-conductive ink layer 70 has an optical density of greater than or equal to 2 to prevent light scattering and leakage from LCD display cell 52. A first conductive ink layer 72 is then disposed over non-conductive ink layer 70 along the side perimeter surface of front polarizer 54 to interface with indium tin oxide layer 56 and the upper side surface of LCD display cell 52. A second conductive ink layer 74 is then applied over first conductive ink layer 72 on the vertical side perimeter of LCD display cell 52 and over nonconductive ink layer 70 on the bottom side of LCD display cell 52 to interface with conductive tape 60. Conductive ink layers 72 and 74 cooperate to provide a conductive path of ESD discharge 66 from indium tin oxide layer 56 over non-conductive ink layer 70 and to conductive tape 60 and ground 50. In the example embodiment, conductive ink layers 72 and 74 are applied as two separate layers that overlap at the vertical side surface of LCD display cell 52. In an alternative embodiment, a single application of conductive ink may be used. In the example embodiment, conductive ink 72 and 74 have a sheet resistance of less than or equal to $10^3$ Ohms per square and an optical density of greater than or equal to 2. In alternative embodiments, alternative nonconductive and conductive inks may be used to adjust the sheet resistance so that optical quality of presented visual images have a desired quality. For instance, adjustments to conductive ink sheet resistance may be made based upon touch detection constraints, display panel size and other factors with some experimentation to ensure that ESD discharge does not cause display image black spots.

Figure 4:
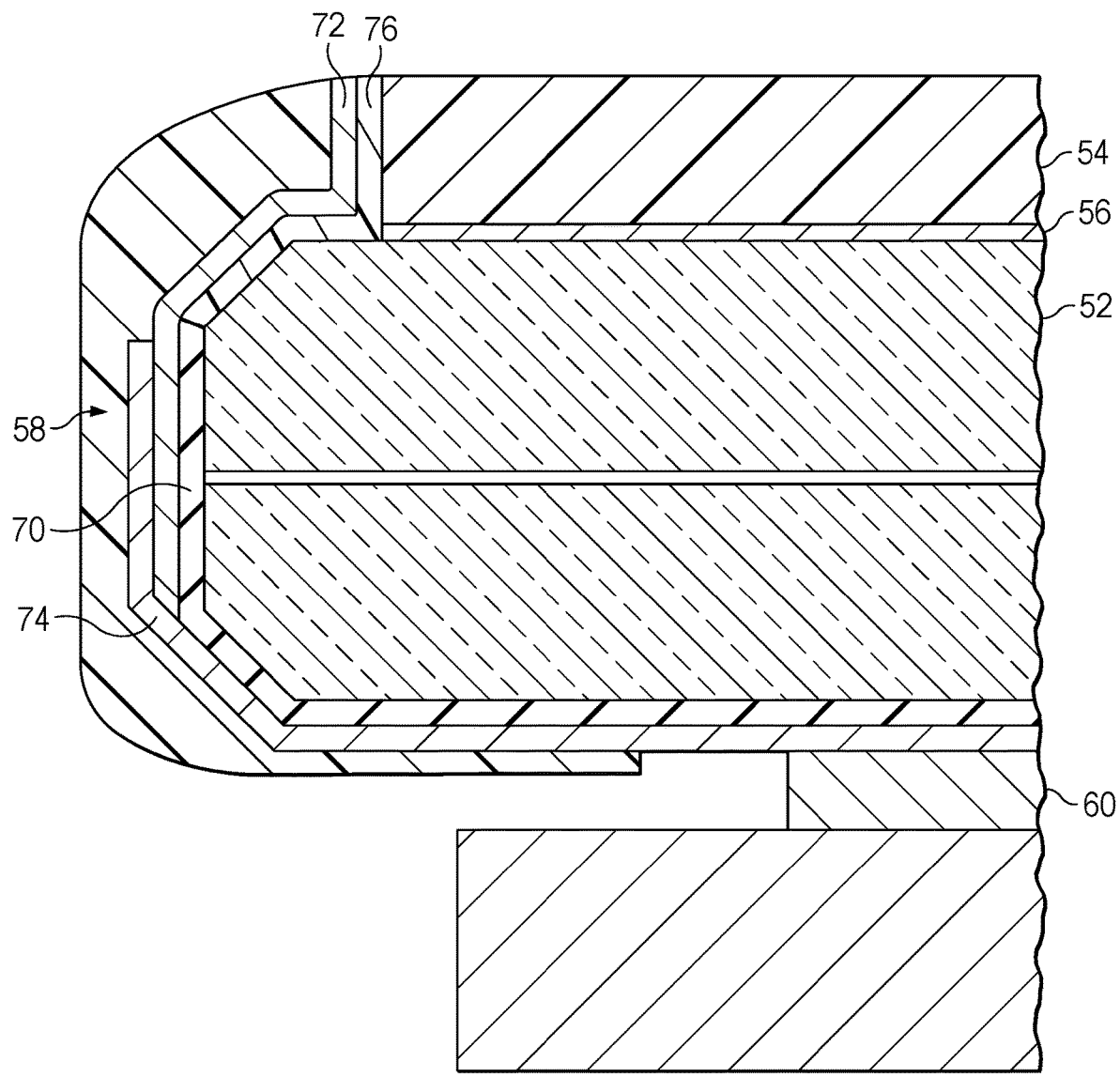
FIG. 4 depicts a cross-sectional view of an alternative embodiment of an edge-to-edge display having conductive ink interfaced with the display panel to manage electrostatic discharge.

Referring now to FIG. 4, a cross-sectional view depicts an alternative embodiment of an edge-to-edge display having conductive ink 58 interfaced with the display panel to manage electrostatic discharge. In the example embodiment, nonconductive ink is applied first to separate LCD display cell 52 from the conductive ink to better manage transfer of ESD discharge from indium tin oxide layer 56 to ground. A first non-conductive ink layer 70 is applied to the vertical and lower portion of LCD display cell 52 as with FIG. 3A. A second non-conductive ink layer 76 is applied at the vertical side surface of front polarizer 54 to interface with non-conductive ink layer 70 and provide a layer of increased resistance between LCD display cell 52, indium tin oxide layer 56 and front polarizer 54 and the conductive ink interfaced with ground. Non-conductive ink layer 76 may have a slightly less resistivity than non-conductive ink layer 70 and total resistance may also be set by ink layer thickness so that an ESD discharge of a defined size associated with black spot disruption of visual images will pass to the conductive ink layer before the visual image disruption occurs or becomes excessive. Conductive ink layer 72 is applied over non-conductive ink layer 76 and interfaced with conductive ink layer 74 to provide the conductive path to ground as described above. The terms "non-conductive" and "conductive" with respect to the ink layers are relative and intended to guide one of skill in the art to select inks with resistivity that optimizes presentation of visual images and detection of touches at display panels of different sizes. In the example embodiment of FIG. 4, the goal in selection of non-conductive ink resistivity and thickness is to provide a light leakage of charge to the conductive ink so that ESD discharges do not occur that disrupt presentation of visual images while conductivity at indium tin oxide layer 56 adequately supports capacitive touch detection.

Although the present invention has been described in detail, it should be understood that various changes, substitutions and alterations can be made hereto without departing from the spirit and scope of the invention as defined by the appended claims.

What is claimed is:

1. An information handling system comprising:
    a processor operable to execute instructions that process information;
    a memory interfaced with the process and operable to store the instructions and information;
    a graphics processing unit interfaced with the processor and operable to further process the information to define visual images;
    a display having a display panel interfaced with the graphics processing unit to present the visual images and including touch detection to detect touches as inputs and communicated to the processor, the display having a conductive ink applied to at least a portion of the display panel perimeter to provide a conductive path from an outer layer at the display panel front to a conductive structure at the display panel rear side, the conductive structure interfaced with ground;
    a first non-conductive ink directly applied to a first portion of the display panel perimeter between the display panel and the conductive ink; and
    a second non-conductive ink directly applied to a second portion of the display panel perimeter between the display panel and the conductive ink, the first non-conductive ink having greater conductivity than the second non-conductive ink.

2. The information handling system of claim 1 further comprising an adhesive conductive material coupling the display panel to the conductive structure, the conductive ink extending from the perimeter to the rear and interfaced with the adhesive conductive material.

3. The information handling system of claim 1 wherein the display panel comprises a liquid crystal display panel.

4. The information handling system of claim 3 wherein the display outer layer comprises a polarizer having indium tin oxide disposed on an inner surface.

5. The information handling system of claim 1 wherein the display panel comprises an organic light emitting diode display panel.

6. The information handling system of claim 1 wherein:
the first non-conductive ink is applied at a polarizer at the display panel front and a portion of a display cell located under the polarizer; and
the second non-conductive ink is applied at the display cell to the display panel rear side.

7. A method for manufacture of a display, the method comprising:
assembling a display panel operable to present visual images at a front side;
applying a conductive ink to a portion of a perimeter of the display panel, the conductive ink extending to a rear side of the display panel;
coupling the display panel to a conductive structure acting as a ground;
interfacing the conductive ink with the ground; and
managing communication of charge to the ground with first and second nonconductive inks having first and second different conductivity disposed between the conductive ink and the display panel.

8. The method of claim 7 further comprising:
coupling the display panel to the conductive structure with conductive tape; and
interfacing the conductive ink with the ground through the conductive tape.

9. The method of claim 7 wherein the assembling a display panel further comprises:
coupling a polarizer as a front side to a display cell, the display cell having capacitive touch detection; and
disposing indium tin oxide between the polarizer and the display cell to enhance capacitive touch detection through the polarizer.

10. The method of claim 9 further comprising directly interfacing the indium tin oxide and the conductive ink.

11. The method of claim 10 further comprising:
Applying the first and second non-conductive ink to the portion of the perimeter of the display panel between the conductive ink and the display panel; and
maintaining a direct interface between the conductive ink and the indium tin oxide.

12. The method of claim 9 further comprising:
applying the first non-conductive ink between the conductive ink and the display panel at the polarizer and contacting the indium tin oxide, the first non-conductive ink having a first conductivity that allows charge to pass from the indium tin oxide to the conductive ink; and
applying the second non-conductive ink between the conductive ink and the display panel display cell, the second non-conductive ink having a second conductivity of less than the conductivity of the first non-conductive ink.

13. The method of claim 12 further comprising directly interfacing the conductive ink and a conductive adhesive that couples the display panel to the conductive structure.

14. A display comprising:
a display panel operable to present visual images and including touch detection to detect touches as inputs at a front side;
a structure coupled to the display panel rear side to support the display panel in a viewing position;
a conductive ink applied to at least a portion of the display panel perimeter to provide a conductive path from proximate the display panel front face to a ground of the structure at the display panel rear side; and
first and second non-conductive inks disposed between the display panel and conductive ink to manage charge communication to ground.

15. The display of claim 14 wherein the display panel comprises:
a polarizer exposed at the front face;
a display cell behind the polarizer to present images through the polarizer; and
an indium tin oxide layer between the display panel and the polarizer.

16. The display of claim 15 wherein the conductive ink has a direct interface with the indium tin oxide.

17. The display of claim 15 wherein:
the first non-conductive ink is disposed between the indium tin oxide layer and the conductive ink, the first non-conductive ink having a first conductivity; and
the second non-conductive ink is disposed between the display cell and the conductive ink, the second non-conductive ink having a second conductivity of less than the first conductivity.

* * * * *